United States Patent
Wu et al.

(10) Patent No.: US 7,129,600 B2
(45) Date of Patent: Oct. 31, 2006

(54) CONTROL CIRCUIT WITH MULTIPLE POWER SOURCES

(75) Inventors: Li-Te Wu, Hsinchu (TW); Hsi-Yuan Wang, Hsinchu (TW)

(73) Assignee: Winbond Electronics Corp. (TW)

( * ) Notice: Subject to any disclaimer, the term of this patent is extended or adjusted under 35 U.S.C. 154(b) by 531 days.

(21) Appl. No.: 10/293,320

(22) Filed: Nov. 14, 2002

(65) Prior Publication Data

US 2003/0098616 A1   May 29, 2003

(30) Foreign Application Priority Data

Nov. 23, 2001   (TW) .............. 90129130 A

(51) Int. Cl.
*H02J 1/00* (2006.01)
(52) U.S. Cl. ............................ 307/80; 307/85
(58) Field of Classification Search ........... 307/80
See application file for complete search history.

(56) References Cited

U.S. PATENT DOCUMENTS

| | | | | |
|---|---|---|---|---|
| 5,229,761 A | * | 7/1993 | Fuse ........................ 345/99 |
| 5,719,490 A | * | 2/1998 | Germini ..................... 323/265 |
| 5,748,033 A | * | 5/1998 | Kaveh et al. ............... 327/545 |
| 6,031,515 A | * | 2/2000 | Okamoto .................... 345/100 |
| 6,566,935 B1 | * | 5/2003 | Renous ....................... 327/408 |

\* cited by examiner

*Primary Examiner*—Brian Sircus
*Assistant Examiner*—Daniel Cavallari
(74) *Attorney, Agent, or Firm*—Bacon & Thomas PLLC

(57) ABSTRACT

The present invention provides a control circuit with multiple power sources, which accepts an output signal from a comparator circuit. This control circuit with multiple power sources contains two components: one is a voltage transferring circuit, which connects to the comparator and accepts the first and the second input voltages to react the controls of respective output signals for generating the first voltage potential and the second voltage potential; another is an output circuit, which connects to the voltage transferring circuit to react the controls of the first voltage potential and the second voltage potential for deciding the correct output from the first input voltage or the second input voltage.

9 Claims, 4 Drawing Sheets

CONTROL CIRCUIT WITH MULTIPLE POWER SOURCES

FIELD OF THE INVENTION

The present invention is relative to a control circuit, especially for a control circuit with multiple power sources.

BACKGROUND OF THE INVENTION

There are two main power sources of a LCD Driver (Liquid Crystal Display Driver): one is provided by an external power supplier for voltage Vdd, and another is generated by the LCD's internal circuit for voltage Vpp. And, the substrate voltage of the chip's PMOS inside the LCD driver must be higher than the voltages of source electrode and drain electrode, or the heavy leakage current will go through the source electrode or drain electrode to the substrate of PMOS to destroy the chip.

But in current general LCD driver's internal circuit, the output voltage is usually higher than the voltage that the power supplier provides after a period of running time. And for some applications of consumptive products, the output voltage of a running LCD driver may be higher or lower than the voltage that the power supplier provides.

Therefore, the substrate voltage of PMOS must be able to adjust dynamically to maintain the substrate voltage at the highest voltage value inside the chip.

Please refer FIG. 1, which shows the circuit of traditional technique that may modify the output voltage Vout to Vin or Vpp. But for some applications that need to generate two different output voltages to control different circuits, the circuit in FIG. 1 cannot reach this requirement because of its only one output voltage.

So, based on the weak point of traditional technique and with hard working, finally the applicant researches and designs the present invention named "A Control Circuit with Multiple Power Sources".

SUMMARY OF THE INVENTION

The main purpose of present invention is providing a control circuit with multiple power sources, which is able to adjust the output voltage dynamically to keep the substrate voltage of PMOS at the highest voltage value inside the chip without any leakage current. And, this control circuit is also able to output the first voltage potential and the second voltage potential for different usages of different circuits.

Another purpose of present invention is providing a control circuit with multiple power sources, which accepts an output signal from a comparator circuit. This control circuit with multiple power sources contains two components: one is a voltage transferring circuit, which connects to the comparator and accepts the first and the second input voltages to react the controls of respective output signals for generating the first voltage potential and the second voltage potential; another is an output circuit, which connects to the voltage transferring circuit to react the controls of the first voltage potential and the second voltage potential for deciding the correct output from the first input voltage or the second input voltage.

Based on above concept, the comparator of the present invention is able to accept the first input voltage and the second input voltage, and to compare the first input voltage with the second voltage for generating the output signal.

Based on above concept, the transferring circuit of the present invention can be integrated by one inverter, two PMOS, and two NMOS.

Based on above concept, the output circuit of the present invention can be integrated by two PMOS.

Based on above concept, the output voltage of the present invention can be used to provide the substrate voltage potential of a PMOS.

Based on above concept, the PMOS of the present invention can be implemented in the internal chip of a lcd Driver.

Based on above concept, the control circuit with multiple power sources can be used to avoid the leakage current going through the source electrode or drain electrode to the substrate inside the PMOS.

The other purpose of present invention is providing a control circuit with multiple power sources, which accepts an output signal from a comparator circuit. This control circuit with multiple power sources contains a voltage transferring circuit, which connects to the comparator and accepts the first and the second input voltages to react the control of the output signal, to transfer the output voltage potentials of the voltage transferring circuit, and to generate the first voltage potential and the second voltage potential.

Based on above concept, the comparator of the present invention can be used to compare the first input voltage with the second input voltage to generate the output signal.

Based on above concept, the transferring circuit of the present invention can comprise one inverter, two PMOS, and two NMOS.

Based on above concept, the first and the second voltage potentials that are generated by the voltage transferring circuit of the present invention can be used to provide two circuits with different input voltage values.

The present invention may best be understood through the following description with reference to the accompanying drawings, in which:

DETAILED DESCRIPTION OF THE PREFERRED EMBODIMENT

Figure 1:
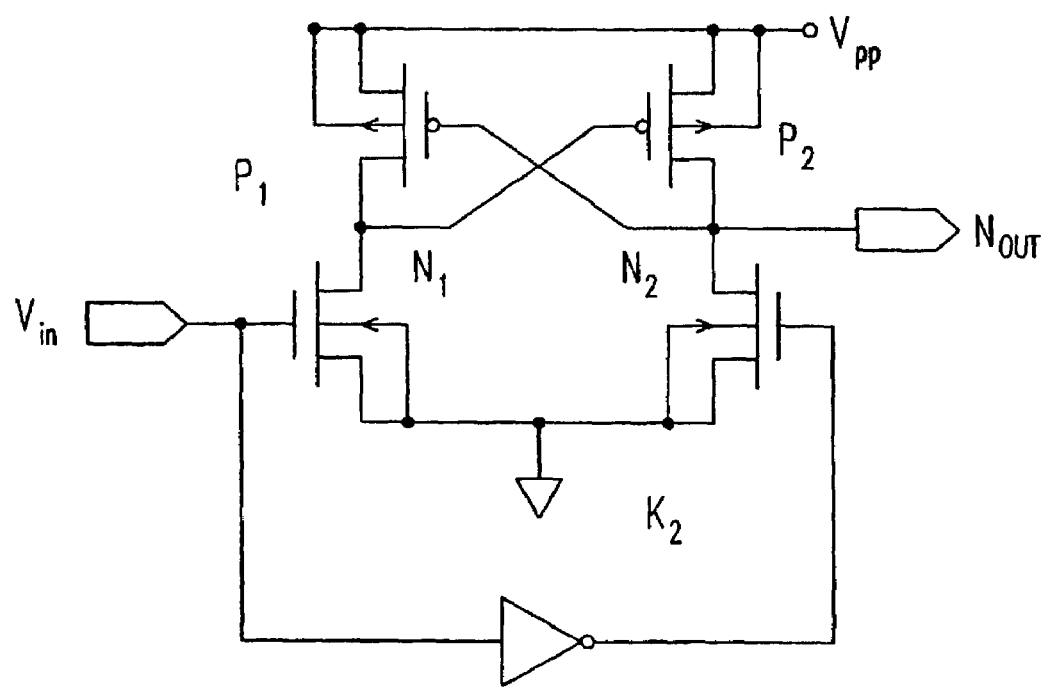
FIG. 1: The circuit of traditional technique in present invention.
Figure 2A:
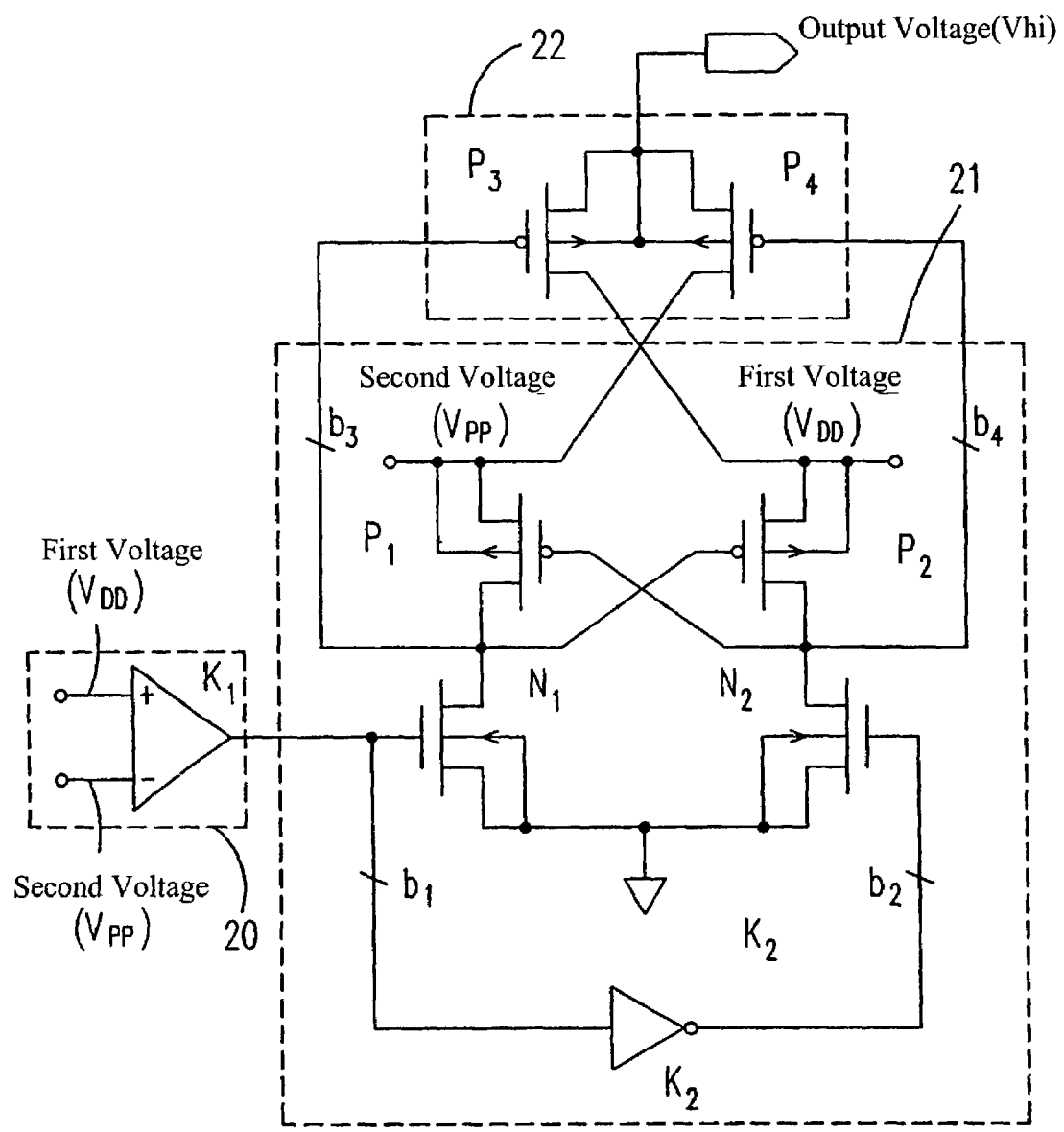
FIGS. 2(a) (b): The circuits of better invoked examples in present invention.

Please refer FIG. 2(a), which shows the circuit of present example with better solution. The present invention provides a control circuit with multiple power sources, which accepts the voltage compared between the first input voltage Vdd (which is a voltage source that is provided by the power supplier outsides the LCD driver) and the second input voltage Vpp (which is a voltage source that is generated by the internal circuit of the insides the LCD driver) by a Comparator Circuit 20 and generates an output signal. This control circuit with multiple power sources contains a Voltage Transferring Circuit 21 and an Output Circuit 22.

This Voltage Transferring Circuit 21 connects to the Comparator Circuit 20 and accepts the first input voltage Vdd and the second input voltage Vpp, to react the control of the output signal and to generate the first voltage potential and the second voltage potential. And this Voltage Transferring Circuit 21 can comprise one inverter, two PMOS, and two NMOS.

This Output Circuit 22 connects to the Voltage Transferring Circuit 21, to react the control of the first and the second voltage potential and decides to output the first voltage value Vdd or the second voltage value Vpp, And this Output Circuit 22 can be integrated by two PMOS.

The operating output of FIG. 2(a) are listed as the table below:

leakage current going to the substrate from the source electrode or drain electrode inside the PMOS.

Figure 2B:
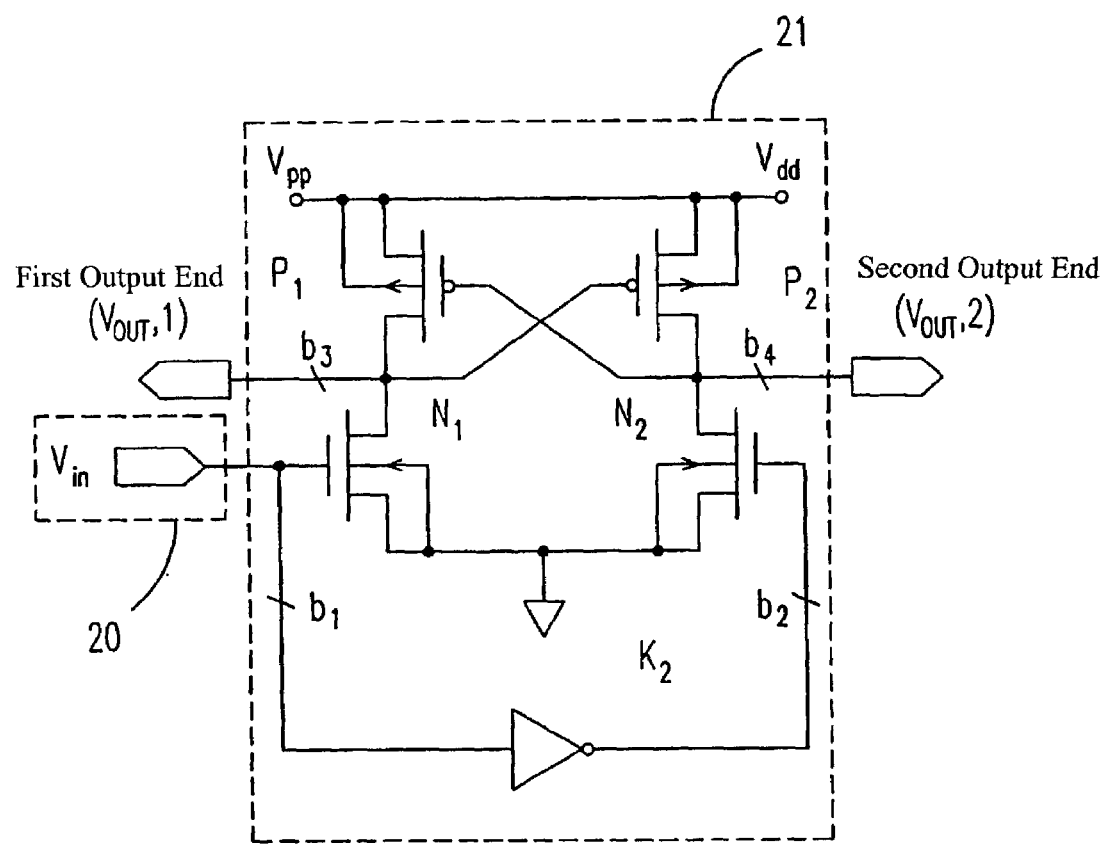

Please refer FIG. 2(b), and from Table 1 we may find that the output voltage potential of b3 and b4 will be different values. So, whenever two circuits need different voltages for input, we just generate a signal by Comparator Circuit 20 and input it to the Voltage Transferring Circuit 20, then we

TABLE 1

|  | Output of Comparator Circuit | N1 | N2 | P1 | P2 | P3 | P4 | Voltage of b1 | Voltage of b2 | Voltage of b3 | Voltage of b14 | Output of Output Circuit |
|---|---|---|---|---|---|---|---|---|---|---|---|---|
| Vdd > Vpp | High | Pass | Close | Close | Pass | Pass | Close | Vdd | 0 | 0 | Vdd | Vdd |
| Vdd < Vpp | Low | Close | Pass | Pass | Close | Close | Pass | 0 | Vdd | Vpp | 0 | Vpp |

From above table we may find that, when Vdd>Vpp, the Comparator Circuit 20 will output the signal of logic high to Voltage Transferring Circuit 21 to make N1 pass but N2 close; triggers P2 to be pass and makes the voltage of b4 to be Vdd; and sends to the gate of transistor P4 of the Output Circuit 22. On the other hand, P1 will be close and makes the voltage of b3 to be 0; and sends to the gate of transistor P3 of the Output Circuit 22.

Because the gate voltage potential of transistor P3 is lower than another end's (that is Vdd), the source electrode and drain electrode of P3 will be pass, then the substrate voltages of P3 and P4 will be Vdd, and finally the output voltage (Vhi) will be Vdd. Therefore, the substrate voltages of P3 and P4 will connect to the higher voltage end, so there will be no any leakage current going through the source electrode or drain electrode to substrate. Regarding P1, because the voltage potential of gate will be higher than the one of source electrode and drain electrode to avoid passing, there will not be any channel between the source electrode and the drain electrode, no matter the leakage current. Furthermore, if Vdd outputs to the PMOS of LCD driver's internal chips, it could avoid the leakage current going through the source electrode or drain electrode to substrate inside the PMOS.

When Vpp>Vdd, the Comparator Circuit 20 will output signal of logic low to Voltage Transferring Circuit 21 to make Ni close; and the logic low signal will be converted to logic high by an inverter K2 to make N2 pass; then triggers P1 pass to make the voltage of b3 to be Vpp, and sends to the gate of P3 transistor of the Output Circuit 22. On the other hand, P2 will be close to make the voltage of b4 to be 0 and sends to the gate of transistor P4 of the Output Circuit 22.

Due to the gate voltage potential of transistor P4 is lower than another end's (that is Vpp), so the source electrode and drain electrode of P4 will be pass, then the substrate voltages of P3 and P4 will be Vpp, and finally the output voltage (Vhi) will be Vpp. Therefore, the substrate voltages of P3 and P4 will connect to the higher voltage end, so there is no leakage current going through the source electrode or drain electrode to substrate, Regarding P2, the voltage potential of gate will be higher than the one of source electrode and drain electrode to avoid passing, so there will be no channel between the source electrode and the drain electrode to pass the leakage current. Further more, if Vpp outputs to the PMOS of LCD driver's internal chips, it could avoid the will get the two different voltage values from the first output end (Vout,1) and the second output end (Vout,2) after transferring.

Figure 3:
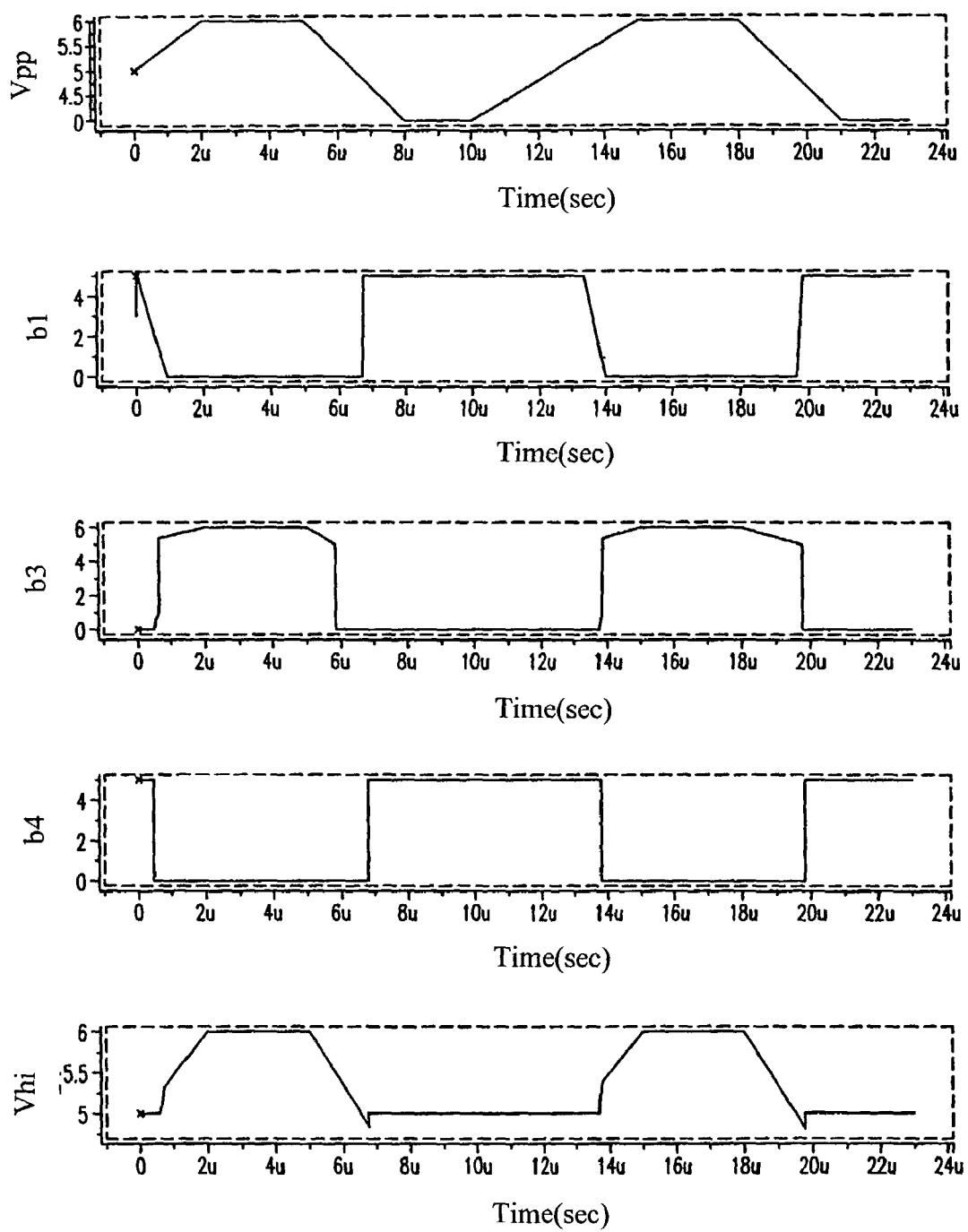
FIG. 3: The voltage simulation results of some special points and output voltage for FIG. 2(a).

Please refer to FIG. 3, which is based on FIG. 2(a) and presents the voltage simulation results of b1, b3, b4, and output voltage (Vhi) depending on the change of Vpp when Vpp is 5 v. From this figure we can find that the control circuit with multiple power sources of the present invention is actually able to keep the output voltage (Vhi) at the highest potential value.

The control circuit with multiple power sources of the present invention may best be understood through the above examples' description, and can be exerted in many applications. But the present invention can never be just limited at above examples, especially when the anode and cathode of the first voltage potential and the second voltage potential are changed, the integration structures of NMOS and PMOS inside the circuits will also be changed, and it is no doubt that above change would be contained in the area of present invention.

To sum up, the control circuit with multiple power source of the present invention can improve the traditional technique, being able to adjust the output voltage dynamically to keep the substrate voltage of a PMOS at the highest voltage potential inside the chip, avoiding the leakage current, and generating the first voltage potential and the second voltage potential for two different circuits. Therefore the present invention is a new technique with product utility.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A control circuit with multiple power sources for accepting an output signal from a comparator circuit, said control circuit with multiple power sources comprising:

a voltage transferring circuit comprising an inverter, two PMOS, and two NMOS, said voltage transferring circuit connecting to said comparator and accepting a first input voltage and a second input voltage, depending on said output signal to control a first voltage potential and a second voltage potential; and an output circuit connecting to said voltage transferring circuit, depending on said first voltage potential and said second voltage potential to control and decide a correct output from said first input voltage and said second input voltage.

2. A control circuit according to claim 1 wherein said comparator is able to accept said first input voltage and said second input voltage, and to compare said first input voltage with said second voltage for generating said output signal.

3. A control circuit according to claim 1 wherein said output circuit is integrated by two PMOS.

4. A control circuit according to claim 1 wherein a output voltage of said control circuit is used to provide a substrate voltage potential of a PMOS.

5. A control circuit according to claim 4 wherein an internal chip of a LCD Driver comprises said PMOS.

6. A control circuit according to claim 5 wherein said control circuit is used to avoid a leakage current going through a source electrode or a drain electrode to a substrate inside said PMOS.

7. A control circuit with multiple power sources for accepting an output signal from a comparator circuit, said control circuit comprising:

a voltage transferring circuit comprising an inverter, two PMOS, and two NMOS, said voltage transferring circuit connecting to said comparator and accepting a first input voltage and a second input voltage, depending on said output signal to control and transfer a output voltage potential of said voltage transferring circuit, and to output a first voltage potential and a second voltage potential.

8. A control circuit according to claim 7 wherein said comparator is used to compare said first input voltage with said second input voltage to generate said output signal.

9. A control circuit according to claim 7 wherein said first voltage potential and said second voltage potential generated by said voltage transferring circuit are used to provide two circuits with different input voltage values.

* * * * *